United States Patent
Baek et al.

(10) Patent No.: US 8,174,875 B2
(45) Date of Patent: May 8, 2012

(54) MEMORY DEVICES INCLUDING MULTI-BIT MEMORY CELLS HAVING MAGNETIC AND RESISTIVE MEMORY ELEMENTS AND RELATED METHODS

(75) Inventors: In-Gyu Baek, Seoul (KR); Jang-Eun Lee, Gyeonggi-do (KR); Se-Chung Oh, Gyeonggi-do (KR); Kyung-Tae Nam, Gyeonggi-do (KR); Jun-Ho Jeong, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 13/091,610

(22) Filed: Apr. 21, 2011

(65) Prior Publication Data

US 2011/0194338 A1    Aug. 11, 2011

Related U.S. Application Data

(62) Division of application No. 11/804,327, filed on May 17, 2007, now Pat. No. 7,952,914.

(30) Foreign Application Priority Data

Jan. 30, 2007 (KR) .................. 2007-09475

(51) Int. Cl.
*G11C 11/00* (2006.01)

(52) U.S. Cl. ........ 365/158; 365/148; 365/163; 365/171; 977/935; 977/754

(58) Field of Classification Search .................. 365/48, 365/55, 62, 66, 74, 78, 80–93, 100, 130, 365/131, 148, 158, 171–173, 225.5, 243.5, 365/46, 94, 113, 129, 163; 216/22; 257/421, 257/E21.665, 2–5, 296, E31.047, E27.006; 438/3, 29, 95, 96, 166, 259, 365, 482, 486, 438/597; 428/810–816, 817–825.1, 826; 977/754, 933–935

See application file for complete search history.

(56) References Cited

U.S. PATENT DOCUMENTS 5,166,758 A   11/1992   Ovshinsky et al.
(Continued)

FOREIGN PATENT DOCUMENTS

JP   2002-246565 A   8/2002
(Continued)

OTHER PUBLICATIONS

Korean Notice to File a Response/Amendment to the Examination Report and English translation corresponding to Korean Patent Application No. 10-2007-0009475; Mailing Date Jul. 14, 2008.
A. Deac et al; "Current driven resistance changes in low resistance $x$ area magnetic tunnel junctions with ultra-thin Al-$O_x$ barriers"; Journal of Applied Physics vol. 95, No. 11; (Jun. 1, 2004) pp. 6792-6794.
Ralf Symanczyk et al; "Electrical Characterization of Solid State Ionic Memory Elements".
S. Q. Liu et al; "Electric-pulse-induced reversible resistance change effect in magnetoresistive films"; Applied Physics Letters, vol. 76, No. 19, (May 8, 2000); pp. 2749-2751.

(Continued)

*Primary Examiner* — Richard Elms
*Assistant Examiner* — Harry W Byrne
(74) *Attorney, Agent, or Firm* — Myers Bigel Sibley & Sajovec, P.A.

(57) ABSTRACT

An integrated circuit memory device may include an integrated circuit substrate, and a multi-bit memory cell on the integrated circuit substrate. The multi-bit memory cell may be configured to store a first bit of data by changing a first characteristic of the multi-bit memory cell and to store a second bit of data by changing a second characteristic of the multi-bit memory cell. Moreover, the first and second characteristics may be different. Related methods are also discussed.

13 Claims, 7 Drawing Sheets

U.S. PATENT DOCUMENTS

| | | | |
|---|---|---|---|
| 6,075,264 | A | 6/2000 | Koo |
| 6,385,082 | B1 | 5/2002 | Abraham et al. |
| 6,507,061 | B1 | 1/2003 | Hudgens et al. |
| 6,577,529 | B1 | 6/2003 | Sharma et al. |
| 6,801,451 | B2 | 10/2004 | Tran et al. |
| 6,829,162 | B2 | 12/2004 | Hosotani |
| 6,870,755 | B2 | 3/2005 | Rinerson et al. |
| 6,906,939 | B2 | 6/2005 | Rinerson et al. |
| 6,982,447 | B2 | 1/2006 | Kim |
| 7,037,749 | B2 | 5/2006 | Horii et al. |
| 7,042,001 | B2 | 5/2006 | Kim et al. |
| 7,061,013 | B2 | 6/2006 | Hideki |
| 7,106,617 | B2 | 9/2006 | Jeon et al. |
| 7,109,539 | B2 | 9/2006 | Lu |
| 7,205,564 | B2 | 4/2007 | Kajiyama |
| 7,308,067 | B2 * | 12/2007 | Lowrey et al. ............ 365/185.24 |
| 2005/0087785 | A1 | 4/2005 | Lu |
| 2005/0226035 | A1 * | 10/2005 | Ghodsi ......................... 365/158 |
| 2006/0250837 | A1 | 11/2006 | Herner et al. |

FOREIGN PATENT DOCUMENTS

| | | |
|---|---|---|
| JP | 2003-179213 | 6/2003 |
| KR | 1020030034500 | 5/2003 |
| KR | 1020030048351 | 6/2003 |
| KR | 10-2003-0055390 A | 7/2003 |
| KR | 10-2004-0049288 A | 6/2004 |
| KR | 10-2004-0091743 A | 10/2004 |
| KR | 1020050116839 | 12/2005 |
| KR | 10-2006-0054511 A | 5/2006 |
| KR | 10-0650115 B1 | 11/2006 |

OTHER PUBLICATIONS

I.G. Baek et al; "Highly Scalable Non-volatile Resistive Memory using Simple Binary Oxide Driven by Asymmetric Unipolar Voltage Pulses"; IEEE, IEDM 04-587, ppgs. 23.6.1-23.6.4.

I.G. Baek et al; "Multi-layer Cross-point Binary Oxide Resistive Memory (OxRRAM) for Post-NAND Storage Application".

M.J. Rozenberg et al; "Nonvolatile Memory with Multilevel Switching: A Basic Model"; Physical Review Letters, The American Physical Society; vol. 92, No. 17 (Apr. 30, 2004) pp. 178302-1/178302-4.

W.W. Zhuang et al; "Novel Colossal Magnetoresistive Thin Film Nonvolatile Resistance Random Access Memory RRAM)"; IEEE (2002) 0/7803-7463-X/02.

L.P. Ma et al; "Organic electrical bistable devices and rewritable memory cells"; Applied Physics Letter vol. 80, No. 16, (Apr. 22, 2002); ppgs. 2997-2999.

"Resistance change memory"; IBM Zurich Research Laboratory http://www.zurich.ibm.com/st/storage/resistance.html.

Tkahito Oyamada et al; "Switching effect in Cu:TCNQ charge transfer-complex thin films by vacuum codeposition"; Applied Physics Letters vol. 83, No. 6, (Aug. 11, 2003) ppgs. 1252-1254.

* cited by examiner

MEMORY DEVICES INCLUDING MULTI-BIT MEMORY CELLS HAVING MAGNETIC AND RESISTIVE MEMORY ELEMENTS AND RELATED METHODS

RELATED APPLICATIONS

This U.S. non-provisional patent application claims the benefit of priority as a divisional of U.S. application Ser. No. 11/804,327 filed May 17, 2007 now U.S. Pat. No. 7,952,914, which claims the benefit of priority under 35 U.S.C. §119 of Korean Patent Application No. 10-2007-09475, filed on Jan. 30, 2007. The disclosures of both of the above referenced applications are hereby incorporated herein by reference in their entireties.

FIELD OF THE INVENTION

The present invention generally relates to electronics, and more particularly, to electronic memory devices and related methods.

BACKGROUND

To increase density in a magnetic random access memory (MRAM) array, it is known to use a memory cell architecture that includes more than one magnetic storage element. For example, U.S. Patent Publication No. 2005/0087785 entitled "Magnetic Random Access Memory Cell" discusses an n-transistor, n-MTJ (magnetic tunnel junction) memory cell providing increased cell density without significantly reducing a lateral size of the MTJ device associated with the memory cell. Conventional multiple-bit memory cell architectures, however, may exhibit a reduced write margin due (at least in part) to the fact that a region of operation during writing may be substantially symmetrical in all four quadrants of a write plane in which the memory cell is written. Consequently, the multiple bits in a given memory cell share the region of operation with one another.

U.S. Pat. No. 7,109,539 entitled "Multiple-Bit Magnetic Random Access Memory Cell Employing Adiabatic Switching" discusses a multiple bit memory cell for use in a magnetic random access memory device. More particularly, the multiple-bit memory cell includes a first adiabatic switching storage element having a first anisotropy axis associated therewith and a second adiabatic switching storage element having a second anisotropy axis associated therewith. The first anisotropy axis and the second anisotropy axis are oriented at a substantially non-zero angle relative to at least one bit line and at least one word line corresponding to the memory cell. The memory cell is configured such that two quadrants of a write plane not used for writing one of the storage elements can be beneficially utilized to write the other storage element so that there is essentially no loss of write margin in the memory cell.

SUMMARY

According to some embodiments of the present invention, an integrated circuit memory device may include an integrated circuit substrate, a memory cell on the integrated circuit substrate, and a controller electrically coupled to the memory cell. The memory cell may be programmable to at least two different magnetoresistive states determined by a magnetic polarization of a free magnetic layer relative to a fixed magnetic layer. The memory cell may also be programmable to at least two different resistance states determined by a resistance characteristic of a layer of a resistive memory material. Accordingly, the memory cell may provide at least four different memory states for the memory cell. The controller may be configured to apply one of a plurality of different magnetic fields to the memory cell to program one of the at least two different magnetoresistive states. The controller may be further configured to apply one of a plurality of different electrical signals through the memory cell to program one of the at least two different resistance states to thereby program the memory cell with at least two bits of data. In addition, the controller may be configured to apply an electrical signal to the memory cell to discriminate between the at least four different memory states and thereby read the at least two bits of data from the memory cell.

The controller may be further configured to apply a second of the plurality of different magnetic fields to the memory cell to program a second of the at least two different magnetoresistive states. The controller may also be configured to apply a second of the plurality of different electrical signals through the memory cell to program a second of the at least two different resistance states. The memory cell may thus be programmed with two second bits of data different than the two first bits of data, and the controller may be configured to apply an electrical signal to the memory cell to discriminate between the at least four different memory states and thereby read the two second bits of data from the memory cell.

The integrated circuit memory device may include a first conductive line coupled between the controller and the memory cell, and a second conductive line coupled between the controller and the memory cell. More particularly, the memory cell may be electrically coupled between the first and second conductive lines, and the first and second conductive lines may be non-parallel. The memory cell may include a magnetic memory element having the fixed and free magnetic layers and a resistive memory element having the layer of the resistive memory material, and the magnetic memory element and the resistive memory element may be electrically coupled in series between the first and second conductive lines. In addition, a non-ohmic device may be coupled in series with the memory cell between the first and second conductive lines, and the non-ohmic device may include a diode (such as a p-n junction diode) and/or a Mott transition layer. Moreover, the layer of the resistive memory material may include an oxide layer between first and second electrode layers.

The integrated circuit memory device may include a bit line, a memory cell, and a word line. The bit line may be coupled between the controller and the memory cell, and a memory cell access transistor may be electrically coupled between the bit line and a source/drain region of the memory cell access transistor. The word line may be electrically coupled between the controller and a control electrode of the memory cell access transistor. The memory cell may include a magnetic memory element having the fixed and free magnetic layers and a resistive memory element having the layer of the resistive memory material, and the magnetic memory element and the resistive memory element may be electrically coupled in series between the bit line and the source/drain region of the memory cell access transistor.

The layer of the resistive memory material may be between the free and fixed magnetic layers, and the layer of the resistive memory material may include a layer of a metal oxide (such as AlO and/or MgO). According to some other embodiments of the present invention, one of the magnetic layers may be between the other of the magnetic layers and the layer of the resistive memory material, and the layer of the resistive memory material include a phase change memory material, a perovskite material, a conductive bridge doped glass, an organic material (such as a bistable organic material or a multi-level organic material), a binary transition metal oxide, a Mott transition layer, and/or a Schottky barrier.

Applying the electrical signal to the memory cell to discriminate between the at least four different memory states may include passing a same electrical current through the layer of the resistive memory material and through the free and fixed magnetic layers. Applying one of a plurality of different electrical signals through the memory cell to program one of the at least two different resistance states may include passing one of a plurality of different electrical currents through the layer of the resistive memory material and through the free and fixed magnetic layers.

According to some other embodiments of the present invention, methods of operating an integrated circuit memory device may be provided. The memory device may include a memory cell programmable to at least two different magnetoresistive states determined by a magnetic polarization of a free magnetic layer relative to a fixed magnetic layer and programmable to at least two different resistance states determined by a resistance characteristic of a layer of a resistive memory material. Accordingly, the memory cell may provide at least four different memory states for the memory cell. The methods of operating the memory cell may include applying one of a plurality of different magnetic fields to the memory cell to program one of the at least two different magnetoresistive states, and applying one of a plurality of different electrical signals through the memory cell to program one of the at least two different resistance states. An electrical signal may then be applied to the memory cell to discriminate between the at least four different memory states and thereby read at least two bits of data from the memory cell.

In addition, a second of the plurality of different magnetic fields may be applied to the memory cell to program a second of the at least two different magnetoresistive states, and a second of the plurality of different electrical signals may be applied through the memory cell to program a second of the at least two different resistance states. An electrical signal may then be applied to the memory cell to discriminate between the at least four different memory states and thereby read at least two second bits of data from the memory cell. More particularly, the at least two second bits of data and the at least two first bits of data may be different.

The layer of the resistive memory material may be between the free and fixed magnetic layers, or one of the magnetic layers may be between the other of the magnetic layers and the layer of the resistive memory material. Moreover, the layer of the resistive memory material may include a phase change memory material, a perovskite material, a conductive bridge doped glass, a organic material (such as a binary organic material or a multi-level organic material), a binary transition metal oxide, a Mott transition layer, and/or a Schottky barrier.

Applying the electrical signal to the memory cell to discriminate between the at least four different memory states may include passing a same electrical current through the layer of the resistive memory material and through the free and fixed magnetic layers. Applying one of a plurality of different electrical signals through the memory cell to program one of the at least two different resistance states may include passing the one of a plurality of different electrical currents through the layer of the resistive memory material and through the free and fixed magnetic layers.

According to still other embodiments of the present invention, an integrated circuit memory device may include an integrated circuit substrate and a memory cell on the integrated circuit substrate. More particularly, the memory cell may include a magnetic memory element and a resistive memory element. The magnetic memory element may include a free magnetic layer and a fixed magnetic layer, and the magnetic memory element may be programmable to at least two different magnetoresistive states determined by a magnetic polarization of the free magnetic layer relative to the fixed magnetic layer. The resistive memory element may include a layer of a resistive memory material, and the resistive memory element may be programmable to at least two different resistance states determined by a resistance characteristic of the layer of the resistive memory material to provide at least four different memory states for the memory cell. Moreover, the free magnetic layer, the fixed magnetic layer, and the layer of the resistive memory material may be electrically coupled in series, and one of the fixed magnetic layer and the free magnetic layer may be between the layer of the resistive memory material and the other of the fixed magnetic layer and the free magnetic layer.

First and second conductive lines may be provided on the integrated circuit substrate with the memory cell being electrically coupled between the first and second conductive lines. In addition, a non-ohmic device may be coupled in series with the memory cell between the first and second conductive lines, and the non-ohmic device, for example, may include a diode (such as a p-n junction diode or a Schottky diode) and/or a Mott transition layer.

A bit line may be coupled to the memory cell, and a memory cell may be electrically coupled between the bit line and a source/drain region of the memory cell access transistor. In addition, a digit line may be provided between the memory cell and the integrated circuit substrate so that the memory cell is between the digit line and the bit line, and an insulating layer may be between the digit line and the memory cell access transistor. The layer of the resistive memory material may include a metal oxide (such as AlO and/or MgO), a phase change memory material, a perovskite material, a conductive bridge doped glass, an organic material (such as a bistable organic material or a multi-level organic material), a binary transition metal oxide, a Mott transition layer, and/or a Schottky barrier.

A controller may be electrically coupled to the memory cell, and the controller may be configured to apply one of a plurality of different magnetic fields to the memory cell to program one of the at least two different magnetoresistive states. The controller may be further configured to apply one of a plurality of different electrical signals through the memory cell to program one of the at least two different resistance states to thereby program the memory cell with at least two bits of data. In addition, the controller may be configured to apply an electrical signal to the memory cell to discriminate between the at least four different memory states and thereby read the at least two bits of data from the memory cell.

The controller may also be configured to apply a second of the plurality of different magnetic fields to the memory cell to program a second of the at least two different magnetoresistive states and to apply a second of the plurality of different electrical signals through the memory cell to program a second of the at least two different resistance states to thereby program the memory cell with two second bits of data different than the two first bits of data. The controller may also be configured to apply an electrical signal to the memory cell to discriminate between the at least four different memory states and thereby read the two second bits of data from the memory cell.

A first conductive line may be coupled between the controller and the memory cell, and a second conductive line may be coupled between the controller and the memory cell. Moreover, the memory cell may be electrically coupled between the first and second conductive lines, and the first and second conductive lines may be non-parallel. Applying the electrical signal to the memory cell to discriminate between the at least four different memory states may include passing a same electrical current through the layer of the resistive memory material and through the free and fixed magnetic layers. Applying one of a plurality of different electrical signals through the memory cell to program one of the at least two different resistance states may include passing one of a plurality of different electrical currents through the layer of the resistive memory material and through the free and fixed magnetic layers.

According to still other embodiments of the present invention, an integrated circuit memory device may include an integrated circuit substrate, and a multi-bit memory cell on the integrated circuit substrate. Moreover, the multi-bit memory cell may be configured to store a first bit of data by changing a first characteristic of the multi-bit memory cell. The multi-bit memory cell may also be configured to store a second bit of data by changing a second characteristic of the multi-bit memory cell, and the first and second characteristics may be different.

A controller may be electrically coupled to the multi-bit memory cell. The controller may be configured to apply one of a plurality of different magnetic fields to the multi-bit memory cell to change the first characteristic of the multi-bit memory cell thereby programming the first bit to a first state. The controller may be further configured to apply one of a plurality of different electrical signals through the multi-bit memory cell to change the second characteristic of the multi-bit memory cell thereby programming the second bit to a second state. The controller may be still further configured to apply a second of a plurality of different magnetic fields to the multi-bit memory cell to change the first characteristic of the multi-bit memory cell thereby programming the first bit to a third state, and to apply a second of a plurality of different electrical signals through the multi-bit memory cell to change the second characteristic of the multi-bit memory cell thereby programming the second bit to a fourth state. More particularly, the first and third states may be different, and the second and fourth states may be different.

The multi-bit memory cell may include a free magnetic layer, a fixed magnetic layer, and a layer of a resistive memory material. Moreover, the first characteristic may include a magnetoresistive state determined by a magnetic polarization of the free magnetic layer relative to the fixed magnetic layer, and the second characteristic may include a resistance state defined by a resistance of the layer of the resistive memory material. The layer of the resistive memory material, for example, may include a metal oxide, a phase change memory material, a perovskite material, a conductive bridge doped glass, an organic material, a binary transition metal oxide, a Mott transition layer, and/or a Schottky barrier.

DETAILED DESCRIPTION

Figure 1A:
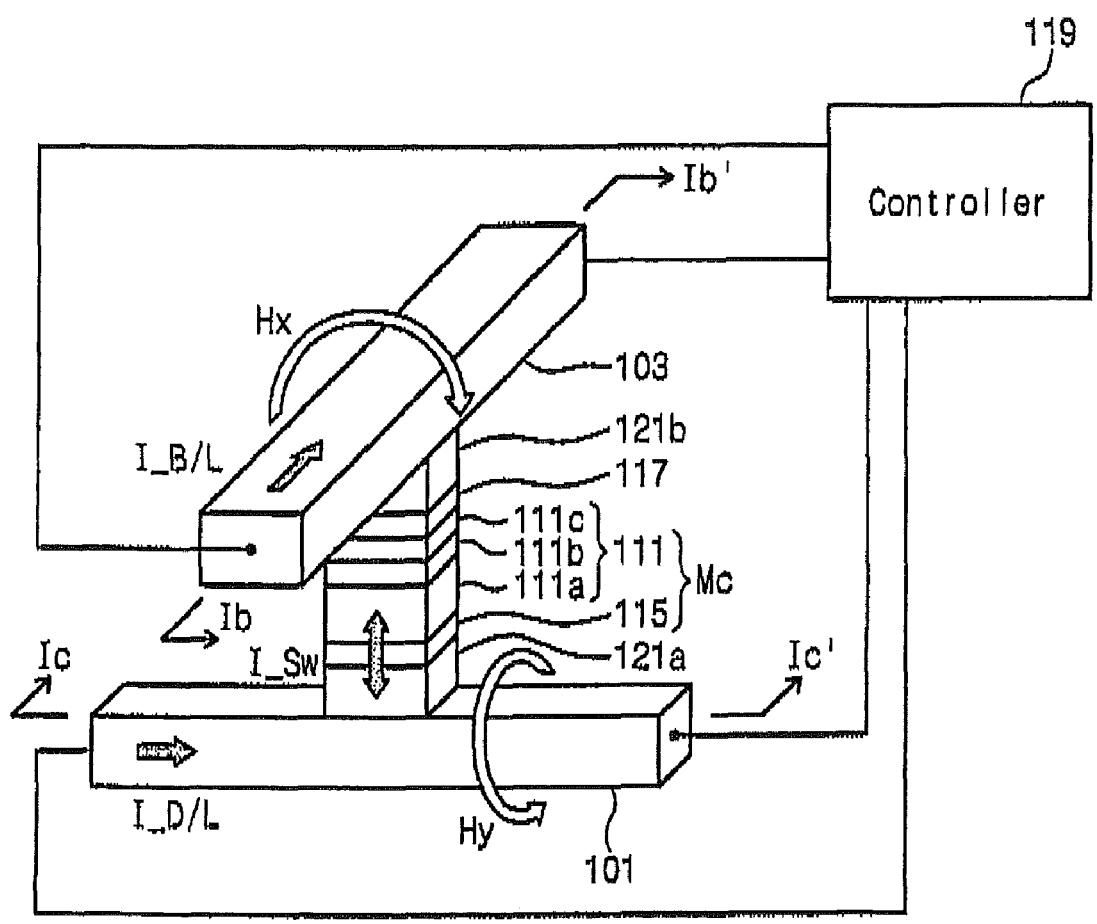
FIG. 1A is a perspective view of elements of a multi-bit memory cell according to some embodiments of the present invention.

The present invention is described more fully hereinafter with reference to the accompanying drawings, in which embodiments of the present invention are shown. This invention may, however, be embodied in many different forms and should not be construed as limited to the embodiments set forth herein. Rather, these embodiments are provided so that this disclosure will be thorough and complete, and will fully convey the scope of the present invention to those skilled in the art. In the drawings, the sizes and relative sizes of layers and regions may be exaggerated for clarity. Like numbers refer to like elements throughout.

It will be understood that when an element or layer is referred to as being "on", "connected to" or "coupled to" another element or layer, it can be directly on, connected or coupled to the other element, or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly. Also, as used herein, "lateral" refers to a direction that is substantially orthogonal to a vertical direction.

The terminology used herein is for the purpose of describing particular embodiments only, and is not intended to be limiting of the present invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the present invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. Accordingly, these terms can include equivalent terms that are created after such time. It will be further understood that terms, such as those defined in commonly used dictionaries, should be interpreted as having a meaning that is consistent with their meaning in the present specification and in the context of the relevant art, and will not be interpreted in an idealized or overly formal sense unless expressly so defined herein. All publications, patent applications, patents, and other references mentioned herein are incorporated by reference in their entirety.

Figure 1B:
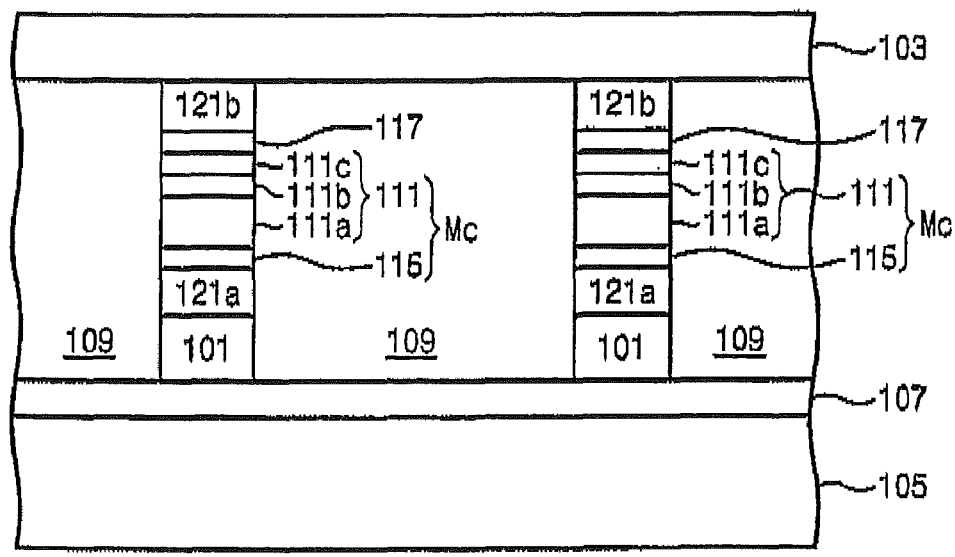
FIGS. 1B and 1C are cross-sectional views of a memory device including the multi-bit memory cell of FIG. 1A taken along section lines Ib-Ib' and Ic-Ic' respectively.
Figure 1C:
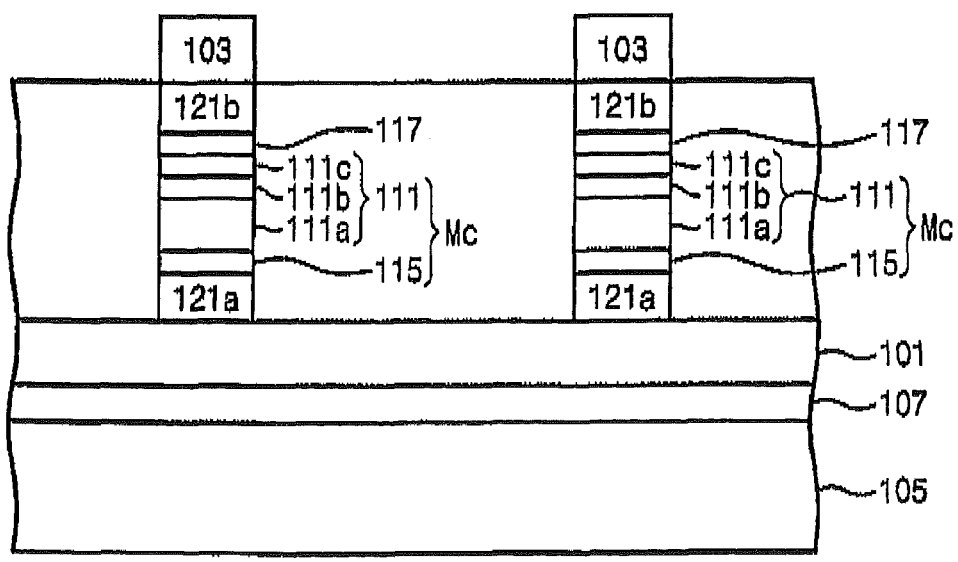

According to some embodiments of the present invention illustrated in FIGS. 1A, 1B, and 1C, an integrated circuit memory device may include a digit line(s) 101, a bit line(s) 103, and a memory cell(s) Mc electrically coupled between the digit line(s) 101 and the bit line(s) 103. As shown in FIGS. 1B and 1C, a plurality of digit lines 101, a plurality of bit lines 103, and a plurality of memory cells Mc may be provided on a semiconductor integrated circuit substrate 105 in a cross-point structure, and a first insulating layer 107 may separate the digit lines 101 from the semiconductor substrate 105. In addition, a second insulating layer 109 may be provided between the first insulating layer 107 and the bit lines 103, and non-ohmic devices 117 (such as diodes and/or Mott transition layers) may be electrically coupled in series with respective memory cells Mc between digit and bit lines 101 and 103. Moreover, conductive plugs 121a and 121b may provide electrical coupling between the memory cells Mc, the non-ohmic devices 117, and/or the digit and bit lines 101 and 103. By providing that parallel digit lines 101 are orthogonal with respect to parallel bit lines 103 with memory cells Mc at intersections of thereof, the memory cells Mc may be separately addressed by controller 119 during read and write operations.

More particularly, each memory cell Mc may include a magnetic memory element 111 and a resistive memory element 115 electrically connected in series between the respective digit line 101 and the respective bit line 103. Each magnetic memory element 111 may include a tunnel insulating layer 111b between a free magnetic layer 111a and a fixed magnetic layer 111c, and each resistive memory element 115 may include a layer of a resistive memory material. While each resistive memory element 115 of FIGS. 1A, 1B, and 1C is provided between a magnetic memory element 111 and a digit line 101, other arrangements may be provided according to other embodiments of the present invention. For example, a magnetic memory element 111 may be provided between a resistive memory element 115 and a digit line 101. While each free magnetic layer 111a of FIGS. 1A, 1B, and 1C is provided between a fixed magnetic layer 111c and a digit line 101, other arrangements may be provided. For example, a fixed magnetic layer 111c may be provided between a free magnetic layer 111a and a digit line 101.

Each magnetic memory element 111 may be programmable to at least two different magnetoresistive states determined by a magnetic polarization of the free magnetic layer 111a relative to the fixed magnetic layer 111c of the magnetic memory element 111. Each resistive memory element 115 may be programmable to at least two different resistance states determined by a resistance characteristic of the layer of the resistive memory material thereof. Combined, the magnetic memory element 111 and the resistive memory element 115 of a memory cell Mc may thus provide at least four different memory states so that at least two bits of data may be stored in each memory cell Mc.

As further shown in FIG. 1A, a controller 119 may be electrically coupled to a memory cell Mc through respective digit and bit lines 101 and 103. By applying different bit line currents I_B/L through the bit line 103 and by applying different digit line currents I_D/L through the digit line 101, the controller 119 may be configured to apply one of a plurality of different magnetic fields Hx and/or Hy to the magnetic memory element 111 of the memory cell Mc to program one of at least two different magnetoresistive states of the magnetic memory element 111. By requiring that both magnetic fields Hx and Hy be applied to a memory cell Mc to write data to the magnetic memory element 111 of the memory cell Mc, each magnetic memory element 111 in a cross-point structure may be separately addressed during read and write operations. Because magnetoresistive programming is non-volatile according to embodiments of the present invention, the magnetoresistive memory state of the magnetic memory element 111 may be maintained without the currents I_B/L and I_D/L and without the magnetic fields Hx and/or Hy, and after loss of power.

The controller 119 may be further configured to apply one of a plurality of different electrical switching currents I_Sw through the memory cell Mc including the resistive memory element 115 to program one of the at least two different resistance states of the resistive memory element 115. Accordingly, the resistive memory element 115 of each memory cell Mc may be separately programmed to one of at least two different memory states. Because resistive programming is non-volatile according to embodiments of the present invention, the resistive memory state of the resistive memory element 115 may be maintained without the switching current I_Sw and after loss of power.

Moreover, the controller 119 may be configured to provide one of the electrical switching currents I_Sw through the memory cell Mc and to apply one of a plurality of different magnetic fields Hx and/or Hy to the memory cell Mc serially or at least partially overlapping in time. Accordingly, the magnetic memory element 111 may be programmed before and/or after programming the resistive memory element 115, of the magnetic memory element 111 and the resistive memory element 115 may be programmed at the same time.

Figure 2:
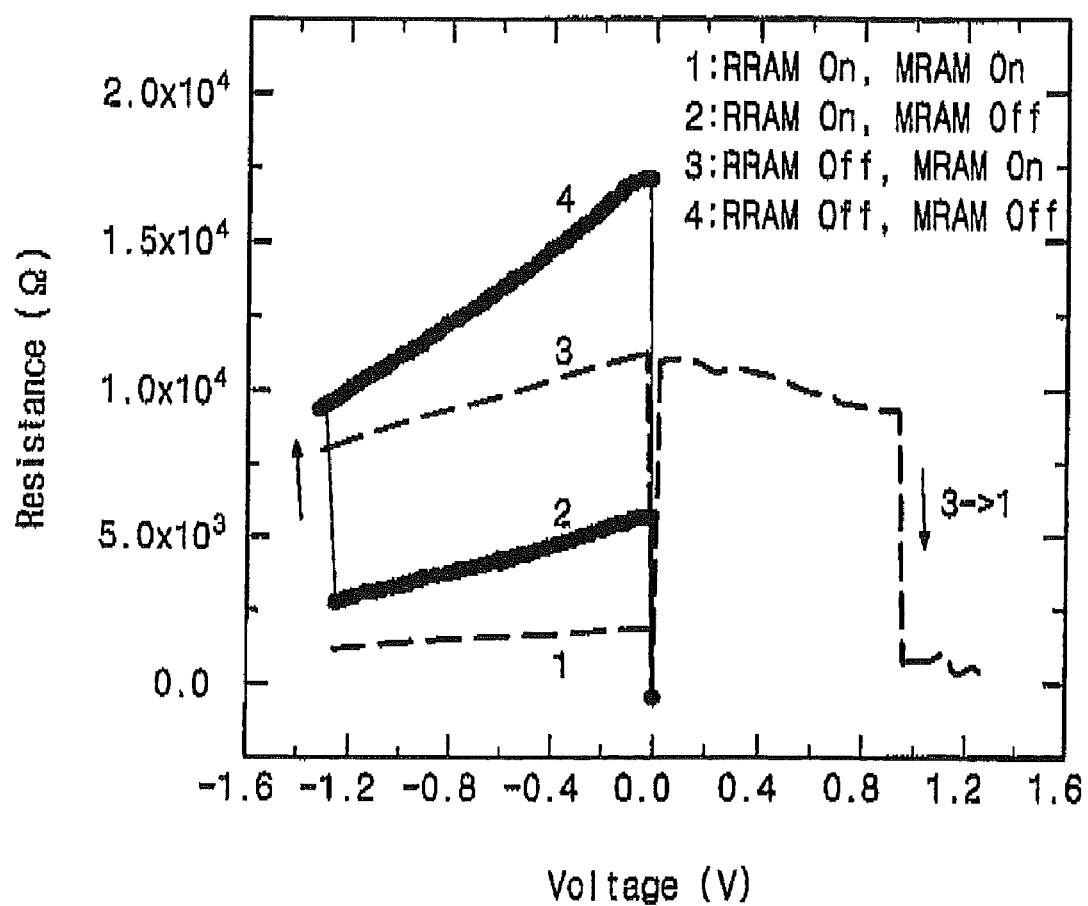
FIG. 2 is a graph illustrating programmable memory states and/or switching properties of a memory cell according to some embodiments of the present invention.

Programmable memory states of a memory cell Mc including a magnetic memory element 111 and a resistive memory element 115 according to some embodiments of the present invention are illustrated in the graph of FIG. 2. In particular, lines 1, 2, 3, and 4 illustrate resistance characteristics of a memory cell Mc at each of four different programmed resistance states. For example, line 1 may illustrate a resistance characteristic of the memory cell Mc when both of the magnetic memory element 111 and the resistive memory element 115 are programmed to relatively low resistance states ("on" memory states); line 2 may illustrate a resistance characteristic of the memory cell Mc when the magnetic memory element 111 is programmed to a relatively high resistance state ("off" memory state) and the resistive memory element 115 is programmed to a relatively low resistance state ("on" memory state); line 3 may illustrate a resistance characteristic of the memory cell Mc when the magnetic memory element 111 is programmed to a relatively low resistance state ("on" memory state) and the resistive memory element 115 is programmed to a relatively high resistance state ("off" memory state); and line 4 may illustrate a resistance characteristic of the memory cell Mc when both of the magnetic memory element 111 and the resistive memory element 115 are programmed to relatively high resistance states ("off" memory states).

The controller 119 may be further configured to separately apply an electrical signal to each memory cell Mc to discriminate between the at least four different memory states and to thereby read the at least two bits of data from the memory cell Mc. In particular, a read current may be applied by the controller 119 through a memory cell Mc to determine a resistance characteristic of the memory cell Mc indicative of a program state of the memory cell Mc. While not shown in FIGS. 1B and 1C, the controller 119 may be separately coupled to each of the bit lines 101 and digit lines 103 using conventional techniques so that each of the memory cells Mc may be separately addressed during read and/or write operations.

A memory cell Mc according to embodiments of the present invention may be reprogrammed many times. After programming a memory cell Mc to a first programmed resistance state as discussed above, for example, the memory cell Mc may be reprogrammed. More particularly, the controller 119 may apply a second of a plurality of different magnetic fields to the memory cell Mc to program a second of at least two different magnetoresistive states of the magnetic memory element 111, and the controller 119 may apply a second of a plurality of different electrical currents through the memory cell Mc to program a second of at least two different resistance states of the resistive memory element 115. Accordingly, the memory cell Mc may be programmed with two second bits of data different than the two first bits of data. As discussed above, the controller 119 may be configured to apply an electrical signal to the memory cell Mc to discriminate between the at least four different memory states and thereby read the two second bits of data from the memory cell.

By providing that a current used to program the resistive memory element 115 of a memory cell Mc is significantly less than a current that may change a magnetoresistive state of the magnetic memory element 111 of the memory cell Mc (for example, due to a spin torque/momentum transfer phenomenon), the resistive memory element 115 and the magnetic memory element 111 of a same memory cell Mc may be programmed independently. If a current used to program the resistive memory element 115 may be sufficient to change a magnetoresistive state of the magnetic memory element, however, a programming/reprogramming of the magnetic memory element 111 may be required after any programming of the resistive memory element 115 of the same memory cell Mc. Moreover, by providing that a current through the memory cell Mc during a read operation is significantly less than a current that many change a state of either of the magnetic memory element 111 and/or the resistive memory element, many read operations may be performed on a memory cell Mc without reprogramming either of the resistive memory element 115 and/or the magnetic memory element 111 thereof.

The magnetic memory element 111 of FIG. 1A, for example, may be programmed to a first state by providing the magnetic field Hx in a first direction and providing the magnetic field Hy in a second direction. The magnetic memory element 111 may then be reprogrammed to a second state (different than the first state) by providing the magnetic field Hx in a third direction (different than the first direction) and providing the magnetic field Hy in a fourth direction (different than the second direction).

According to some embodiments of the present invention, the resistive memory element 115 of FIG. 1A may be programmed to a first state by providing the switching current I_Sw in a first direction, and the resistive memory element 115 may be reprogrammed to a second state (different than the first state) by providing the switching current I_Sw in a second direction (different than the first direction). According to other embodiments of the present invention, the resistive memory element 115 of FIG. 1A may be programmed to a first state by providing the switching current I_Sw of a first magnitude/duration, and the resistive memory element 115 may be reprogrammed to a second state (different than the first state) by providing the switching current I_Sw of a second magnitude/duration (different than the first magnitude/duration). Accordingly, a change in polarity/direction of the switching current I_Sw may not be required.

As discussed above, each magnetic memory element 111 may include a free magnetic layer 111a, a tunnel insulating layer 111b, and a fixed magnetic layer 111c. For example, the free magnetic layer 111a may include a layer of CoFeB; the tunnel insulating layer may include a layer of MgO and/or AlO; and the fixed magnetic layer 111c may include a synthetic antiferromagnetic layer (for example, including layers of CoFe, Ru, and CoFeB) and/or a layer of PtMn. Moreover, each of the conductive plugs 121a and/or 121b may include a layer of a metal, a metal nitride (such as titanium nitride), and/or doped polysilicon. In addition, the free magnetic layer 111a may include a capping layer (such as a layer of Ta and/or Ti) spaced apart from the tunnel insulating layer 111b, and/or the fixed magnetic layer 111c may include a capping layer (such as a layer of Ta and/or Ti) spaced apart from the tunnel insulating layer 111b. Magnetic memory structures including fixed magnetic layers, tunnel insulating layers, and free magnetic layers are discussed, for example, in U.S. Pat. No. 7,092,283, U.S. Pub. No. 2006/0011958, U.S. Pub. No. 2006/0022237, U.S. Pub. No. 2006/0027846, U.S. Pub. No. 2006/0034117, U.S. Pub. No. 2006/0062044, and U.S. Pub. No. 2006/0083054. The disclosures of each of the above referenced patent and patent publications are hereby incorporated herein in their entirety by reference.

As discussed above, the resistive memory element 115 may include a layer of a resistive memory material. More particular, the resistive memory material may include an oxide layer such as a metal oxide (for example, MgO and/or AlO) according to some embodiments of the present invention. According to other embodiments of the present invention, the layer of the resistive memory material may include a phase change memory material, a perovskite material, a conductive bridge doped glass, an organic material (such as a bistable and/or multi-level organic material), a binary transition metal oxide, a Mott transition layer, and/or a Schottky barrier.

As shown in FIGS. 1A, 1B, and 1C, a non-ohmic device 117 may be provided between each memory cell Mc and the respective bit line 103. According to other embodiments of the present invention, a non-ohmic device may instead be provided between each memory cell Mc and the respective digit line 101. According to still other embodiments of the present invention, a non-ohmic device may be provided between a resistive memory element 115 and a magnetic memory element 111 of each memory cell Mc. Moreover, each non-ohmic device 117 may include a diode (such as a p-n junction diode or a Schottky diode) or a Mott transition layer. By providing a non-ohmic device in the cross-point structure of FIGS. 1A-1C, selection of individual memory cells may be facilitated by allowing electrical flow in one direction and impeding electrical flow in the other direction.

Figure 3A:
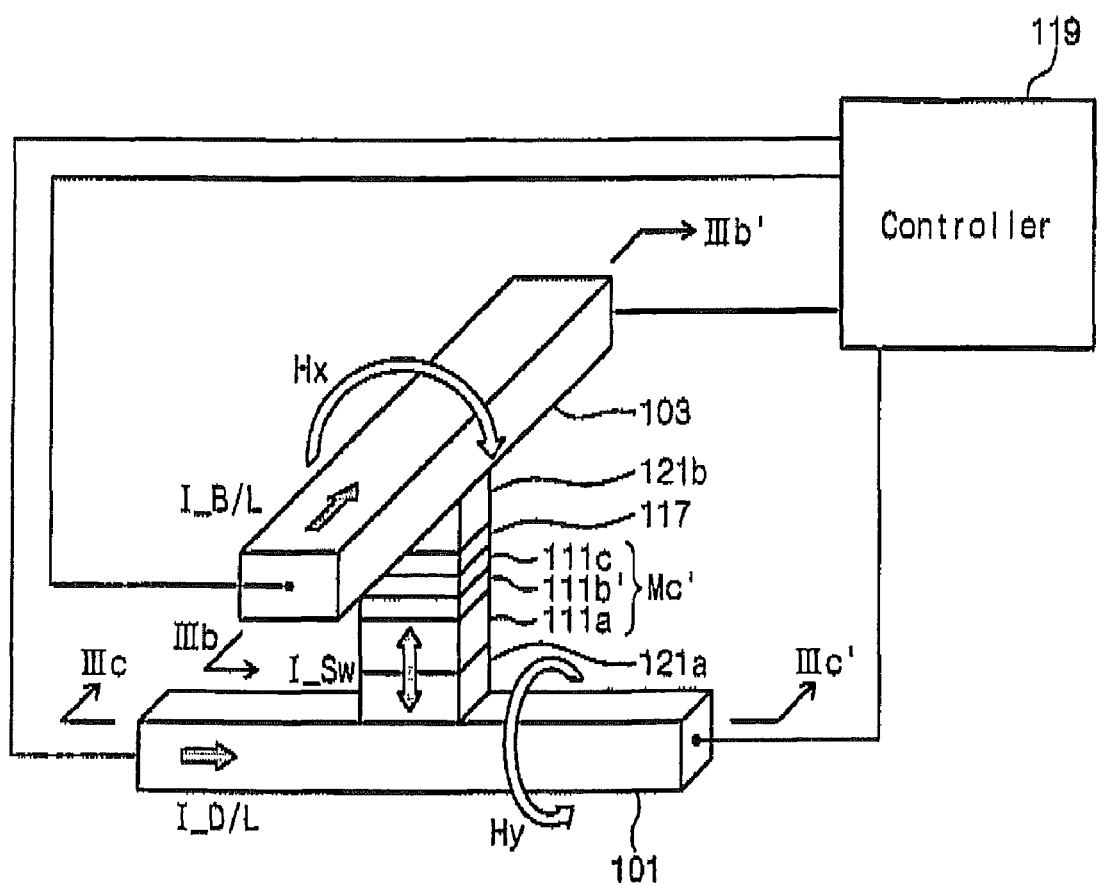
FIG. 3A is a perspective view of elements of a multi-bit memory cell according to some other embodiments of the present invention.
Figure 3B:
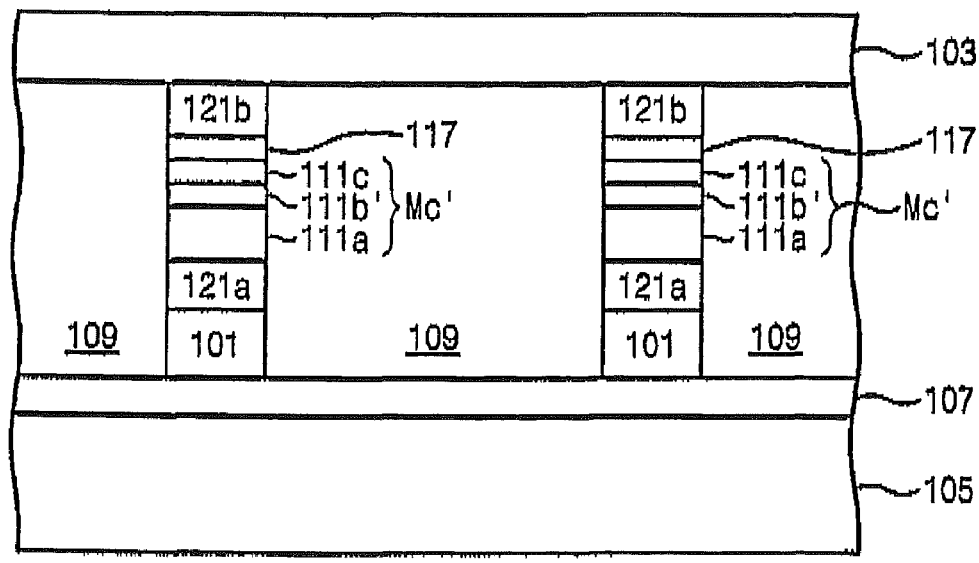
FIGS. 3B and 3C are cross-sectional views of a memory device including the multi-bit memory cell of FIG. 3A taken along section lines IIIb-IIIb' and IIIc-IIIc' respectively.
Figure 3C:
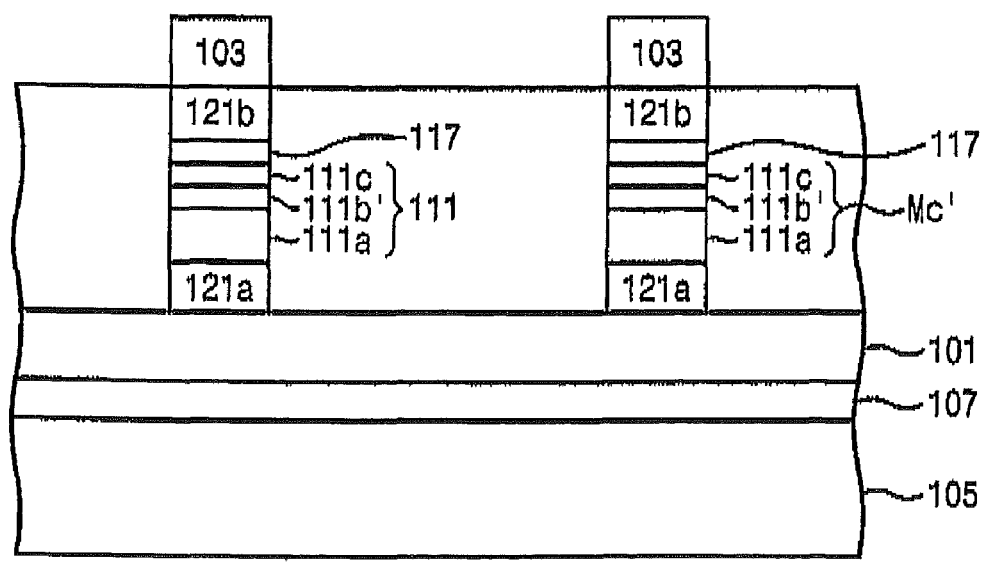

According to some other embodiments of the present invention illustrated in FIGS. 3A, 3B, and 3C, an integrated circuit memory device may include a digit line(s) 101, a bit line(s) 103, and a memory cell(s) Mc' electrically coupled between the digit line(s) 101 and the bit line(s) 103. Structures and operations of the integrated circuit memory device of FIGS. 3A, 3B, and 3C are similar to those of FIGS. 1A, 1B, and 1C and discussion of like elements and operations will not be repeated for FIGS. 3A, 3B, and 3C for the sake of conciseness. In particular, the substrate 105, the first insulating layer 107, the digit lines 101, the second insulating layer 109, the free magnetic layer 111a, and the fixed magnetic layer 111c, the conductive plugs 121a and 121b, the non-ohmic devices 117, and the bit lines 103 of FIGS. 3A, 3B, and 3C may be the same as discussed above with respect to FIGS. 1A, 1B, 1C, and 2. In addition, operations of the controller 119 of FIG. 3A may be the same as discussed above with respect to FIGS. 1A, 1B, 1C, and 2.

In FIGS. 3A, 3B, and 3C, resistive and magnetic memory elements may be integrated in the memory cells Mc'. More particularly, the layer 111b' may function as both a layer of a resistive memory material (as discussed above with respect to the resistive memory element 115) and a tunnel insulating layer of a magnetic memory element (as discussed above with respect to the tunnel insulating layer 111). More particularly, the layer 111b' may include a layer of a metal oxide such as MgO and/or AlO.

Accordingly, each memory cell Mc' may be programmable to at least two different magnetoresistive sates determined by a magnetic polarization of the free magnetic layer 111a relative to the fixed magnetic layer 111c of the memory cell Mc'. Each memory cell Mc' may also be programmable to at least two different resistance states determined by a resistance characteristic of the layer 111b'. Combined, the programmable magnetoresistive and resistance states of the memory cell Mc' may provide at least four different memory states so that at least two bits of data may be stored in each memory cell Mc'. Operations of programming the magnetoresistive and resistance states of a memory cell Mc' using bit line currents I_B/L, digit line currents I_D/L, magnetic fields Hx and Hy, and switching currents I_Sw may be the same as discussed above with respect to FIGS. 1A, 1B, 1C, and 2. Moreover, resulting programmable memory states of each memory cell Mc' may be the same as discussed above with respect to FIG. 2.

As discussed above, multi-bit memory cells Mc and/or Mc' may be used in cross-point integrated circuit memory structures according to some embodiments of the present invention. According to other embodiments of the present invention discussed below with respect to FIGS. 4A, 4B, and 4C, multi-bit memory cells Mc" may be used in 1-transistor/1-cell memory structures, and the multi-bit memory cells Mc" may be implemented as discussed above with respect to either multi-bit memory cells Mc of FIGS. 1A, 1B, and 1C or multi-bit memory cells Mc' of FIGS. 3A, 3B, and 3C.

Figure 4A:
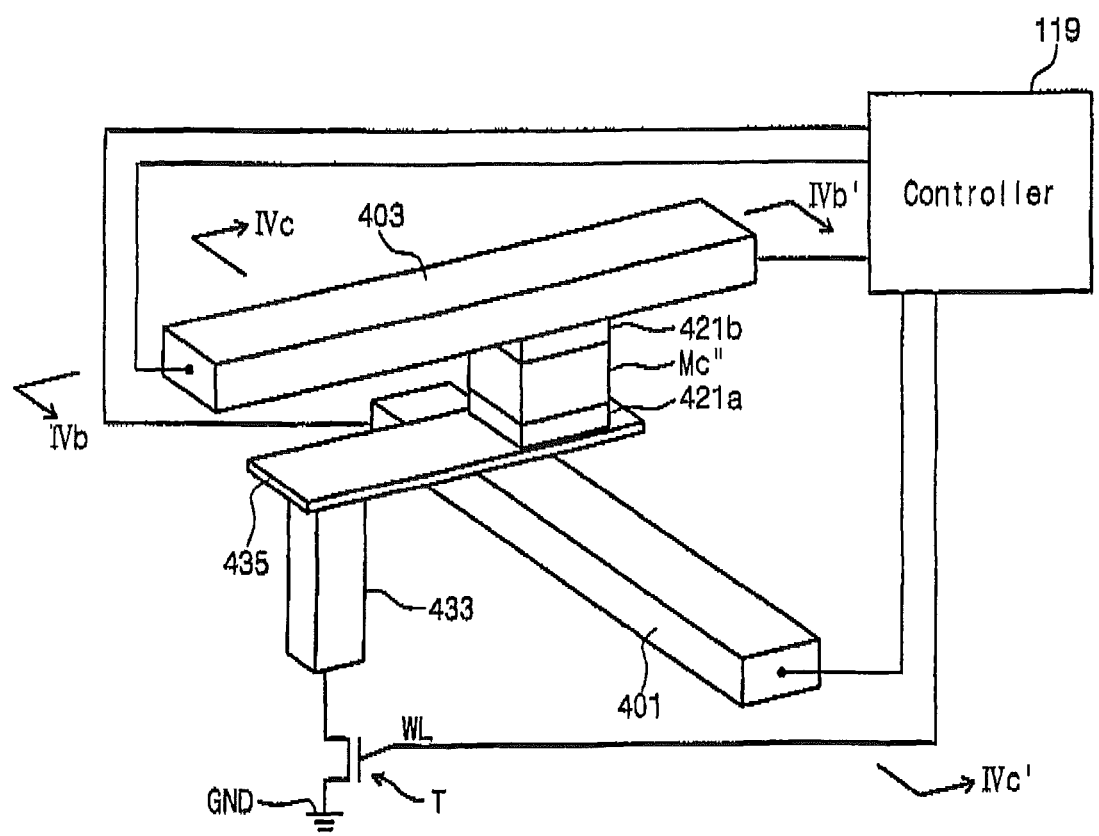
FIG. 4A is a perspective view of elements of a multi-bit memory cell according to still other embodiments of the present invention.
Figure 4B:
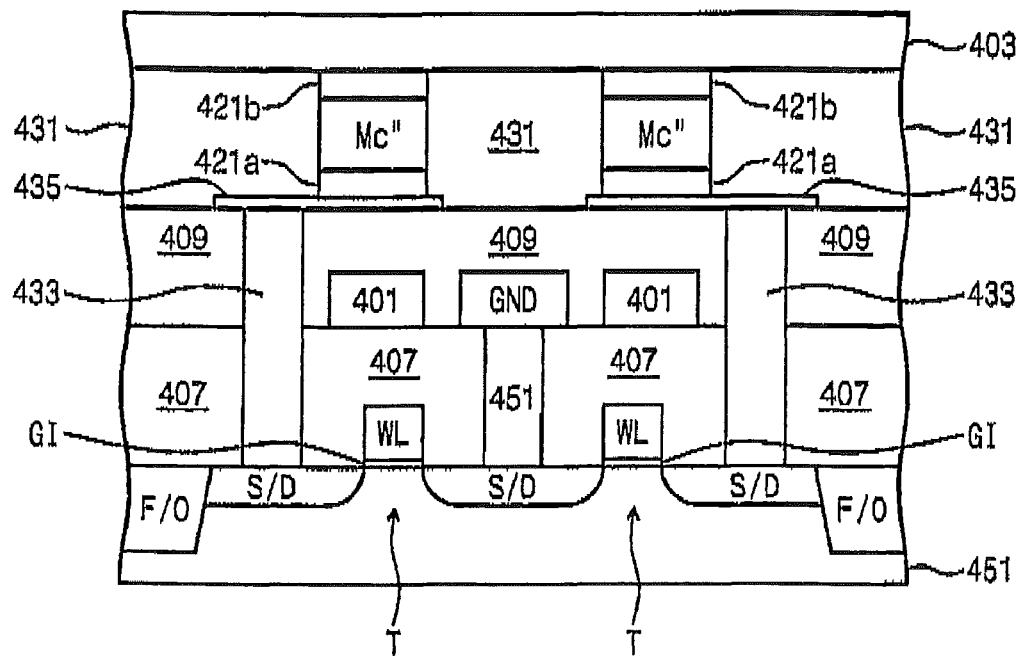
FIGS. 4B and 4C are cross-sectional views of a memory device including the multi-bit memory cell of FIG. 4A taken along section lines IVb-IVb' and IVc-IVc' respectively.
Figure 4C:
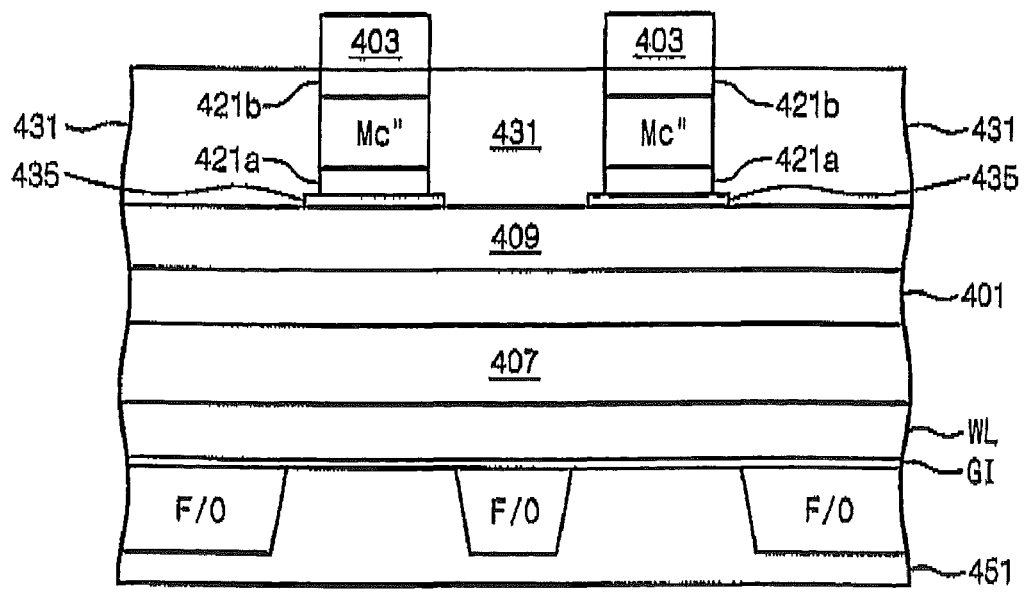

As shown in FIGS. 4A, 4B, and 4C, each multi-bit memory cell Mc" may be electrically coupled between a bit line 403 and a source/drain region S/D of a respective memory cell access transistor T. More particularly, field oxide regions F/O may define active regions of a semiconductor substrate 451, and each memory cell access transistor T may include a word line WL gate electrode between source/drain regions S/D of an active region of the semiconductor substrate 451, with a gate insulating layer GI between word lines WL and the substrate 451. Moreover, a second source/drain region S/D of each transistor T may be electrically coupled to a ground electrode GND through a conductive plug 457. The ground electrode GND and digit lines 401 may be provided on a first insulating layer 407 so that the digit lines are separated from the word lines WL. Moreover, conductive layers 435 may be provided on a second insulating layer 409 so that the conductive layers 435 are separated from the digit lines 401.

Each memory cell Mc" may be electrically coupled in series with conductive plugs 421a and 421b between a respective conductive layer 435 and digit line 403, and each conductive layer 435 may be electrically coupled to a respective source/drain region S/D through a respective conductive plug 433. Moreover, the memory cells Mc" and conductive plugs 421a and 421b may extend through a third insulating layer 431, and the digit lines may be provided on the third insulating layer 431 and exposed portions of the conductive plugs 421b.

Word lines WL and digit lines 401 may thus be parallel, and bit lines 403 may be orthogonal with respect to the word lines WL and the digit lines 401. Moreover, each memory cell Mc" may be provided physically between respective digit and bit lines 401 and 403 at intersections thereof, and each memory cell Mc" may be electrically coupled between a respective bit line 403 and memory cell access transistor T.

The controller 419 may be separately coupled to each of the word lines WL, separately coupled to each of the digit lines 401, and separately coupled to each of the bit lines 403. Each memory cell Mc" may thus be programmable to at least two different magnetoresistive sates determined by a magnetic polarization of a free magnetic layer of the memory cell Mc" relative to a fixed magnetic layer of the memory cell Mc". Each memory cell Mc" may also be programmable to at least two different resistance states determined by a resistance characteristic of a layer of a resistive memory material of the memory cell Mc". Combined, the programmable magnetoresistive and resistance states of each memory cell Mc" may provide at least four different memory states so that at least two bits of data may be stored in each memory cell Mc". Resulting programmable memory states of each memory cell Mc" may be the same as discussed above with respect to FIG. 2.

Operations of the controller 419 programming magnetoresistive states of a memory cell Mc" using currents through respective bit and digit lines 403 and 401 to generate respective magnetic fields through the memory cell Mc" may be similar to operations discussed above with respect to FIGS. 1A-1C and/or 3A-3C with the respective memory cell access transistor T turned off to reduce/prevent current flow through the memory cell Mc". Operations of the controller 419 programming resistance states of a memory cell Mc" may include turning the respective memory cell access transistor T on and generating a current through the respective bit line 403, memory cell Mc", and transistor T. Characteristics of currents to program particular resistance states of a memory cell Mc" may be similar to those discussed above with respect to FIGS. 1A-C and/or 3A-3C.

As discussed above, magnetoresistive states of a multi-bit memory cell (Mc, Mc', and/or Mc") may be programmed by applying magnetic fields to the memory cell, and resistive states of the multi-bit memory cell may be programmed by applying an electrical current through the memory cell according to some embodiments of the present invention. According to other embodiments of the present invention, both magnetoresistive and resistive states of a multi-bit memory cell may be programmed by applying respective currents to the memory cell provided that one of the states can be programmed using currents significantly lower than currents required to program/reprogram the other of the states. For example, magnetoresistive states of a multi-bit memory cell may be programmed according to a spin torque/momentum transfer phenomenon that requires significantly higher currents than may be required to program resistance states of the memory cell. Then, resistance states of the multi-bit memory cell may be programmed/reprogrammed using significantly lower currents that do not alter the programmed magnetoresistive state. Accordingly, programming of a resistance state of a multi-bit memory cell may be required to follow programming of a magnetoresistive state of the memory cell, because a status of the resistance state may be altered each time the magnetoresistive state is programmed.

As discussed above with respect to FIGS. 1A-1C, each resistive memory element 115 may include a layer of a resistive memory material such as a metal oxide (e.g., AlO and /or MgO), a phase change memory material, a perovskite material, a conductive bridge doped glass, an organic material (e.g., a bistable and/or multi-level organic material), a binary transition metal oxide (e.g., NiO, $TiO_2$, $ZrO_2$, etc.), a Mott transition layer, and/or a Schottky barrier. A layer of a resistive memory material used to store a second bit of data in a memory cell may provide a relatively high sensing margin (i.e., >10x), a relatively low operating voltage (i.e., <3V), and relatively good thermal stability. Moreover, cross-talk between magnetoresistive and resistive memory elements may be relatively low, and/or resistive memory materials may be substantially insensitive to sizing.

Phase change memory materials (e.g., chalcogenide materials such as alloys including Ge, Sb, and Te) as used in resistance memory devices are discussed by way of example in U.S. Pat. No. 5,166,758 entitled "Electrically Erasable Phase Change Memory"; in U.S. Pat. No. 6,507,061 entitled "Multiple Layer Phase-Change Memory"; in U.S. Pat. No. 7,037,749 entitled "Methods For Forming Phase Changeable Memory Devices"; in U.S. Pat. No. 7,042,001 entitled "Phase Change Memory Devices Including Memory Elements Having Variable Cross-Sectional Areas"; and in U.S. Pat. No. 7,061,013 entitled "Phase Change Storage Cells For Memory Devices, Memory Devices Having Phase Change Storage Cells And Methods Of Forming The Same". The disclosures of each of the above referenced patents are hereby incorporated herein in their entirety by reference.

Perovskite memory materials as used in resistance memory devices may include CMR materials (such as $Pr_{0.7}Ca_{0.3}MnO_3$), transition metal oxides (such as Cr-doped $SrZrO_3$ and/or Cr-doped $SrTiO_3$), and/or ferroelectric materials (such as Lead Zirconate Titanate, also referred to as PZT). Use of CMR materials in memory devices is discussed by way of example in the reference by Zhuang et al. entitled "Novell Colossal Magnetoresistive Thin Film Nonvolatile Resistance Random Access Memory (MRAM)", IEEE, 2002, in the reference by Liu et al. entitled "Electric-Pulse-Induced Reversible Resistance Change Effect In Magnetoresistive Films", Applied Physics Letters (APL), Vol. 76, No. 19, pages 2749-2751, May 8, 2000, and in U.S. Pat. No. 6,870,755 entitled "Re-Writable Memory With Non-Linear Memory Element". Use of transition metal oxides in memory devices is discussed by way of example in the reference published by the IBM Zurich Research Laboratory entitled "Resistance Change Memory: Transition-Metal Oxides For Nonvolatile Memory Applications", http://www.zurich.imb.com/st/storage/resistance.html. Use of ferroelectric materials in memory device is discussed by way of example in U.S. Pat. No. 7,106,617 entitled "Ferroelectric Memory Devices Having A Plate Line Control Circuit And Methods For Operating The Same", in U.S. Pat. No. 6,982,447 entitled "Ferroelectric Memory Devices", and in U.S. Pat. No. 6,075,264 entitled "Structure Of A Ferroelectric Memory Cell And Methods Of Fabricating It". The disclosures of each of the above referenced patents and publications are hereby incorporated herein in their entirety by reference.

Use of conductive bridge doped glasses in resistance memory devices is discussed by way of example in the reference by Symanczyk et al. entitled "Electrical Characterization Of Solid State Ionic Memory Elements", Proceedings of the Non-Volatile Memory Technology Symposium, 2003. Use of organic materials in resistance memory devices is discussed by way of example in the reference by Ma et al. entitled "Organic Electrical Bistable Devices And Rewritable Memory Cells", Applied Physics Letters (APL), Vol. 80, No. 16, pages 2997-2999, Apr. 22, 2002, and in the reference by Oyamada et al. entitled "Switching Effect In Cu: TCNQ Charge Transfer-Complex Thin Films By Vacuum Codeposition", Applied Physics Letters (APL), Vol. 83, No. 6, pages 1252-1254, Aug. 11, 2003. Use of binary transition metal oxides in resistance memory devices is discussed by way of example in the reference by Baek et al. entitled "Highly Scalable Nonvolatile Resistive Memory Using Simple Binary Oxide Driven By Asymmetric Unipolar Voltage Pulses", IDEM Technical Digest, pages 587-590, Dec. 2004, and in the reference by Baek et al. entitled "Multi-Layer Cross-Point Binary Oxide Resistive Memory (OxRRAM) For Post-NAND Storage Application", IDEM Technical Digest, pages 750-753, Dec. 2005. Mott transition layers are discussed, for example, in the reference by Rozenberg et al. entitled "Nonvolatile Memory With Multilevel Switching: A Basic Model," Phys. Rev. Lett. 92, 178302 (2004). The disclosures of each of the above referenced patents and publications are hereby incorporated herein in their entirety by reference.

According to embodiments of the present invention discussed above, an integrated circuit memory device may include an integrated circuit substrate, and a multi-bit memory cell on the integrated circuit substrate. Moreover, the multi-bit memory cell may be configured to store a first bit of data by changing a first characteristic of the multi-bit memory cell. The multi-bit memory cell may also be configured to store a second bit of data by changing a second characteristic of the multi-bit memory cell, and the first and second characteristics may be different. In addition, arrays of multi-bit memory cells according to embodiments of the present invention may be arranged in cross-point structure arrays and/or in word line structure arrays.

More particularly, the multi-bit memory cell may include a free magnetic layer, a fixed magnetic layer, and a layer of a resistive memory material. Moreover, the first characteristic may include a magnetoresistive state determined by a magnetic polarization of the free magnetic layer relative to the fixed magnetic layer, and the second characteristic may include a resistance state defined by a resistance of the layer of the resistive memory material. The layer of the resistive memory material, for example, may include a metal oxide, a phase change memory material, a perovskite material, a conductive bridge doped glass, an organic material, a binary transition metal oxide, a Mott transition layer, and/or a Schottky barrier.

While the present invention has been particularly shown and described with reference to embodiments thereof, it will be understood by those of ordinary skill in the art that various changes in form and details may be made therein without departing from the spirit and scope of the present invention as defined by the following claims.

That which is claimed is:

1. An integrated circuit memory device comprising:
    an integrated circuit substrate;
    a memory cell on the integrated circuit substrate, wherein the memory cell includes,
        a magnetic memory element including a free magnetic layer and a fixed magnetic layer wherein the magnetic memory element is programmable to at least two different magnetoresistive states determined by a magnetic polarization of the free magnetic layer relative to the fixed magnetic layer, and
        a resistive memory element including a layer of a resistive memory material wherein the resistive memory element is programmable to at least two different resistance states determined by a resistance characteristic of the layer of the resistive memory material to provide at least four different memory states for the memory cell, wherein the free magnetic layer, the fixed magnetic layer and the layer of the resistive memory material are electrically coupled in series, and wherein one of the fixed magnetic layer and the free magnetic layer is between the layer of the resistive memory material and the other of the fixed magnetic layer and the free magnetic layer.

2. An integrated circuit memory device according to claim 1 further comprising:
    first and second conductive lines on the integrated circuit substrate wherein the memory cell is electrically coupled between the first and second conductive lines.

3. An integrated circuit memory device according to claim 2 further comprising:
    a non-ohmic device coupled in series with the memory cell between the first and second conductive lines.

4. An integrated circuit memory device according to claim 3 wherein the non-ohmic device comprises at least one of a diode and/or a Mott transition layer.

5. An integrated circuit memory device according to claim 1 further comprising:
    a bit line coupled to the memory cell; and
    a memory cell access transistor wherein the memory cell is electrically coupled between the bit line and a source/drain region of the memory cell access transistor.

6. An integrated circuit memory device according to claim 5 further comprising:
    a digit line between the memory cell and the integrated circuit substrate so that the memory cell is between the digit line and the bit line; and
    an insulating layer between the digit line and the memory cell access transistor.

7. An integrated circuit memory device according to claim 1 wherein the layer of the resistive memory material comprises a metal oxide.

8. An integrated circuit memory device according to claim 1 wherein the layer of the resistive memory material comprises a phase change memory material, a perovskite material, a conductive bridge doped glass, an organic material, a binary transition metal oxide, a Mott transition layer, and/or a Schottky barrier.

9. An integrated circuit memory device according to claim 1 further comprising:
    a controller electrically coupled to the memory cell wherein the controller is configured to apply one of a plurality of different magnetic fields to the memory cell to program one of the at least two different magnetoresistive states and to apply one of a plurality of different electrical signals through the memory cell to program one of the at least two different resistance states to thereby program the memory cell with at least two bits of data, and wherein the controller is configured to apply an electrical signal to the memory cell to discriminate between the at least four different memory states and thereby read the at least two bits of data from the memory cell.

10. An integrated circuit memory device according to claim 9 wherein the controller is further configured to apply a second of the plurality of different magnetic fields to the memory cell to program a second of the at least two different magnetoresistive states and to apply a second of the plurality of different electrical signals through the memory cell to program a second of the at least two different resistance states to thereby program the memory cell with two second bits of data different than the two first bits of data, and wherein the controller is configured to apply an electrical signal to the memory cell to discriminate between the at least four different memory states and thereby read the two second bits of data from the memory cell.

11. An integrated circuit memory device according to claim 9 further comprising:
    a first conductive line coupled between the controller and the memory cell; and
    a second conductive line coupled between the controller and the memory cell, wherein the memory cell is electrically coupled between the first and second conductive lines and wherein the first and second conductive lines are non-parallel.

12. An integrated circuit memory device according to claim 9 wherein applying the electrical signal to the memory cell to discriminate between the at least four different memory states includes passing a same electrical current through the layer of the resistive memory material and through the free and fixed magnetic layers.

13. An integrated circuit memory device according to claim 9 wherein applying one of a plurality of different electrical signals through the memory cell to program one of the at least two different resistance states includes passing one of a plurality of different electrical currents through the layer of the resistive memory material and through the free and fixed magnetic layers.

* * * * *